(12) United States Patent
Yoshitani

(10) Patent No.: US 11,362,092 B2
(45) Date of Patent: *Jun. 14, 2022

(54) SEMICONDUCTOR DEVICE AND SEMICONDUCTOR INTEGRATED CIRCUIT

(71) Applicant: SOCIONEXT INC., Yokohama (JP)

(72) Inventor: Masanori Yoshitani, Yokohama (JP)

(73) Assignee: SOCIONEXT INC., Yokohama (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/116,914

(22) Filed: Dec. 9, 2020

(65) Prior Publication Data

US 2021/0091082 A1   Mar. 25, 2021

Related U.S. Application Data

(60) Division of application No. 16/231,067, filed on Dec. 21, 2018, now Pat. No. 10,971,494, which is a
(Continued)

(51) Int. Cl.
*H01L 27/092* (2006.01)
*H01L 29/08* (2006.01)
(Continued)

(52) U.S. Cl.
CPC ...... *H01L 27/0924* (2013.01); *H01L 29/0642* (2013.01); *H01L 29/0847* (2013.01);
(Continued)

(58) Field of Classification Search
CPC ............ H01L 29/0642; H01L 29/0847; H01L 29/41758; H01L 29/42356; H01L 29/4238;
(Continued)

(56) References Cited

U.S. PATENT DOCUMENTS 6,528,981 B1   3/2003   Tsubaki
8,928,382 B1   1/2015   Ler et al.
(Continued)

FOREIGN PATENT DOCUMENTS

CN     105493264 A    4/2016
JP     2011-101322 A  5/2011
(Continued)

OTHER PUBLICATIONS

Office Action issued by European Patent Office in corresponding European Patent Application No. 16507234.5, dated Jul. 30, 2021.
(Continued)

*Primary Examiner* — Monica D Harrison
(74) *Attorney, Agent, or Firm* — ArentFox Schiff LLP

(57) ABSTRACT

A semiconductor device includes: element isolation regions; a projecting semiconductor region; a plurality of first gate electrodes each formed on both side surfaces and a top surface of a portion of the projecting semiconductor region, the plurality of first gate electrodes being formed between a pair of opposed end portions of the element isolation regions and being component elements of a plurality of transistors; at least one second gate electrode formed between the first gate electrodes, in the same layer as a layer where the plurality of first gate electrodes are formed, and applied with a voltage for turning off the transistor.

8 Claims, 7 Drawing Sheets

Related U.S. Application Data continuation of application No. PCT/JP2016/069089, filed on Jun. 28, 2016.

(51) Int. Cl.
   *H01L 21/82* (2006.01)
   *H01L 29/78* (2006.01)
   *H01L 29/417* (2006.01)
   *H01L 29/423* (2006.01)
   *H01L 29/06* (2006.01)
   *H01L 21/8234* (2006.01)

(52) U.S. Cl.
   CPC .... *H01L 29/41758* (2013.01); *H01L 29/4238* (2013.01); *H01L 29/42356* (2013.01); *H01L 29/78* (2013.01); *H01L 29/785* (2013.01); *H01L 29/7851* (2013.01); *H01L 21/823437* (2013.01)

(58) Field of Classification Search
   CPC ... H01L 29/78; H01L 29/785; H01L 29/7851; H01L 27/0924; H01L 21/823437
   USPC .......................................................... 257/369
   See application file for complete search history.

(56) References Cited

U.S. PATENT DOCUMENTS

| | | | |
|---|---|---|---|
| 10,971,494 B2* | 4/2021 | Yoshitani | ............ H01L 29/4238 |
| 2009/0243725 A1 | 10/2009 | Abe et al. | |
| 2011/0109396 A1 | 5/2011 | Tanabe | |
| 2013/0043536 A1 | 2/2013 | Rahm et al. | |
| 2014/0264610 A1 | 9/2014 | Yang et al. | |
| 2014/0332883 A1 | 11/2014 | Kwon et al. | |
| 2015/0008525 A1 | 1/2015 | Fukuzaki et al. | |
| 2015/0123207 A1 | 5/2015 | Deguchi et al. | |
| 2015/0137256 A1 | 5/2015 | Kawa et al. | |
| 2015/0340466 A1 | 11/2015 | Fukuda et al. | |
| 2016/0078164 A1 | 3/2016 | Hsieh et al. | |
| 2016/0126232 A1 | 5/2016 | Liu et al. | |
| 2016/0172360 A1 | 6/2016 | Shimbo | |
| 2018/0130799 A1 | 5/2018 | Shimbo | |
| 2018/0267373 A1* | 9/2018 | Yoshida | ................ G02F 1/1336 |
| 2019/0109133 A1 | 4/2019 | Shimbo | |
| 2021/0013201 A1 | 1/2021 | Shimbo | |

FOREIGN PATENT DOCUMENTS

| | | |
|---|---|---|
| JP | 2013-046065 A | 3/2013 |
| JP | 2015/015388 A | 1/2015 |
| JP | 2015/220420 A | 12/2015 |
| JP | 2016-516301 A | 6/2016 |
| WO | WO-2001/008299 A1 | 2/2001 |
| WO | WO- 2012/120599 A1 | 9/2012 |

OTHER PUBLICATIONS

Chinese Office Action issued against corresponding Chinese Application No. 201680087172.4 dated Apr. 19, 2021.
Extended Supplementary European Search Report issued in Patent Application No. 16907234.5, dated May 16, 2019.
Borremans, J., et al., Perspective of RF Design in Future Planar and FinFET CMOS, 2008 IEEE Radio Frequency Integrated Circuits Symposium, pp. 75-78, Jun. 17, 2008.
Salas, S., et al., Fringing Gate Capacitance Model for Triple-Gate FinFe, Silicon Monolithic Integrated Circuits in FR Systems (SIRF), pp. 90-92, Jan. 21, 2013.
International Search Report of related International Patent Application No. PCT/JP2016/069089 dated Aug. 9, 2016.

* cited by examiner

SEMICONDUCTOR DEVICE AND SEMICONDUCTOR INTEGRATED CIRCUIT

CROSS-REFERENCE TO RELATED APPLICATIONS

This application is a divisional of U.S. application Ser. No. 16/231,067, filed Dec. 21, 2018, which is a continuation application of International Application PCT/JP2016/069089 filed on Jun. 28, 2016, and designated the U.S., the entire contents of each of which are incorporated herein by reference.

FIELD

The present invention relates to a semiconductor device and a semiconductor integrated circuit.

BACKGROUND

Some field effect transistors have a fin-shaped structure (Fin Field Effect Transistor: FinFET) in which a gate insulating film and a gate electrode are formed on both side surfaces and a top surface of part of a projecting (fin-shaped) semiconductor region which is formed on a substrate to extend in one direction, and a source region and a drain region are formed in the projecting semiconductor region on both sides of the gate electrode (refer to Patent Literature 1, for instance). Since a FinFET is likely to be filled with heat because of its structure, some means to reduce heat generation by layout needs to be devised.

FIG. 8 is a view illustrating a structure example of the FinFET having a multi-finger structure in which a plurality of gate electrodes are formed in a comb-teeth shape (finger shape). In FIG. 8, 101 denotes projecting (fin-shaped) semiconductor regions formed on a substrate to extend in one direction.

In portions of the projecting semiconductor regions 101, gate electrodes 102 covering their both side surfaces and top surfaces with gate insulating films therebetween are formed so as to intersect with the projecting semiconductor regions 101, and source regions and drain regions are formed in the projecting semiconductor regions 101 on both sides of the gate electrodes 102. The gate electrodes 102 are formed of, for example, polysilicon and are connected to a metal wiring line 103 through vias.

Further, in FIG. 8, 104 denotes element isolation insulating film (Shallow Trench Isolation: STI) for isolating a transistor forming region, and 105 denotes dummy gate electrode which is disposed between the gate electrode 102 and STI 104 and are formed on the same layer as that of the gate electrodes 102. The dummy gate electrodes 105 are also formed of, for example, polysilicon.

As illustrated in FIG. 9, the FinFET having the multi-finger structure is more likely to generate heat as the number of fingers is larger due to the influence of heat generation of adjacent transistors. That is, the FinFET having the multi-finger structure illustrated in FIG. 8 is more likely to generate heat than the FinFET where the number of fingers is 1.

One possible method to reduce the heat generation of the FinFET is a method to set the number of fingers to, for example, 1 as illustrated in FIG. 10 to decrease the influence of the heat generation from adjacent transistors, thereby reducing the heat generation. FIG. 10 is a view illustrating a structure example of the FinFET where the number of fingers is 1, and the same constituent elements as the constituent elements illustrated in FIG. 8 are denoted by the same reference numerals.

However, in the FinFET where the number of fingers is 1 as illustrated in FIG. 10, the distance x between STIs 104 disposed at both sides of gate electrode 102 is short. The shorter the distance x between STIs 104 is, the lower a saturation current Ion of the transistor is, as illustrated in FIG. 11 due to STI stress (stress by STIs 104). Accordingly, in order to obtain the same saturation current Ion as that of the FinFET having the multi-finger structure illustrated in, for example, FIG. 8, an increase in the number of transistors is required, leading to an increase in power consumption and the area.

Patent Literature 1: Japanese Laid-open Patent Publication No. 2015-220420

SUMMARY

A semiconductor device in one embodiment includes: element isolation regions; a projecting semiconductor region; a plurality of first gate electrodes each formed on both side surfaces and a top surface of a portion of the projecting semiconductor region, the plurality of first gate electrodes being formed between a pair of opposed end portions of the element isolation regions and being component elements of a plurality of transistors; a second gate electrode formed between the first gate electrodes, in the same layer as a layer where the plurality of first gate electrodes are formed, and applied with a voltage for turning off the transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, an embodiment of the present invention will be described based on the drawings.

Figure 1:
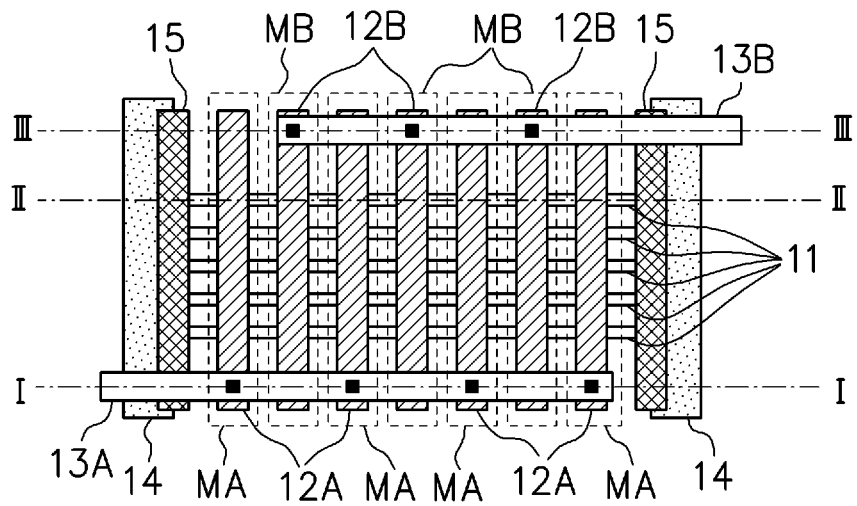
FIG. 1 is a view illustrating a structure example of a semiconductor device in this embodiment.
Figure 2A:
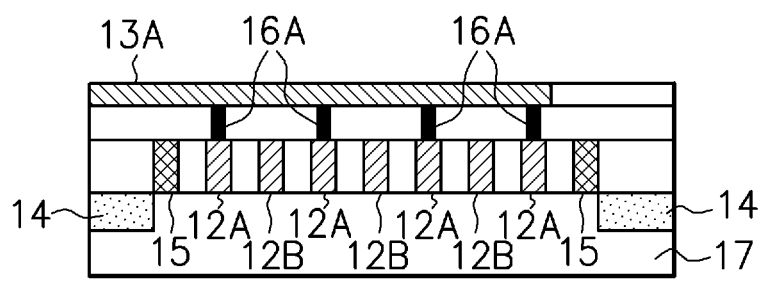
FIG. 2A is a schematic sectional view along the I-I line in FIG. 1.
Figure 2B:
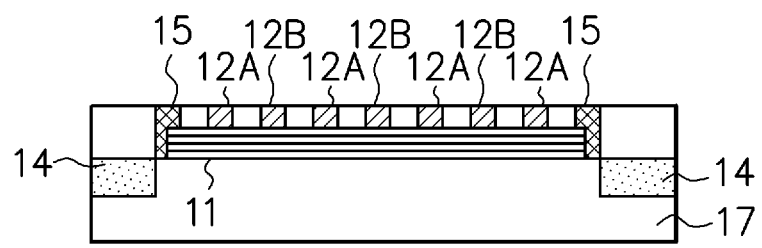
FIG. 2B is a schematic sectional view along the II-II line in FIG. 1.
Figure 2C:
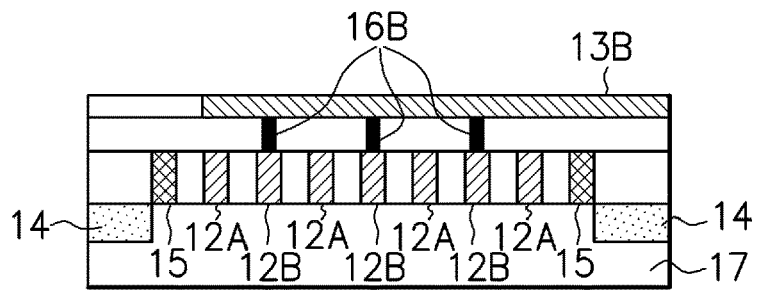
FIG. 2C is a schematic sectional view along the line in FIG. 1.

FIG. 1 is a view illustrating a structure example of a field effect transistor having a fin-shaped structure (Fin Field Effect Transistor: FinFET) as a semiconductor device in one embodiment of the present invention. FTG. 2A is a schematic sectional view along the I-I line in FIG. 1, FIG. 2B is a schematic sectional view along the II-II line in FIG. 1, and FIG. 2C is a schematic sectional view along the line in FIG. 1.

In the FinFET in this embodiment, projecting (fin-shaped) semiconductor regions 11 extending in one direction are formed on a substrate 17. In portions of the projecting semiconductor regions 11, not-illustrated gate insulating films are formed on their both side surfaces and top surfaces. In the portions of the projecting semiconductor regions 11, gate electrodes 12A, 12B covering the both side surfaces and the top surfaces are formed with the gate insulating films therebetween. Source regions and drain regions are formed in the projecting semiconductor regions 11 at both sides of the gate insulating film-covered portions of the projecting semiconductor regions 11, in other words, at both sides of the gate electrodes 12A, 12B.

The gate electrodes 12A, 12B are formed in the same layer, between a pair of opposed end portions of element isolation regions, and are made of, for example, polysilicon. The gate electrodes 12A are connected through vias 16A to a metal wiring line 13A to which a signal is input. The gate electrodes 12B are connected through vias 16B to a metal wiring line 13B to which the same voltage as that of a back gate is applied. Further, the source regions and the drain regions formed in the projecting semiconductor regions 11 are connected to source electrodes and drain electrodes respectively, through not-illustrated contact electrodes.

Further, element isolation insulating films (Shallow Trench Isolation: STI) 14 for isolating a transistor-forming region are formed on the substrate 17. Dummy gate electrodes 15 made of, for example, polysilicon, are each formed between STI 14 and the gate electrode 12A or 12B, in the same layer as that of the gate electrodes 12A, 12B. Incidentally, the semiconductor device illustrated in FIG. 1, FIG. 2A, FIG. 2B, and FIG. 2C can be formed using a known manufacturing method, and can be formed using, for example, at least part of the manufacturing method described in the aforesaid Patent Literature 1.

As described above, the FinFET in this embodiment has a multi-finger structure in which the plurality of gate electrodes 12A to which a signal is applied are formed in a comb-teeth shape (finger shape) between the pair of opposed end portions of the element isolation regions on which STIs 14 are disposed, and the gate electrodes 12B applied with the same voltage as that of the back gate are each disposed between the gate electrodes 12A to which a signal is applied. That is, transistors MB in which the potential of the gate electrodes 12B is clipped so as to produce an off state are each disposed between transistors MA driven according to a signal.

This can reduce heat generation in the FinFET. Further, the distance between STIs 14 formed at both sides of the gate electrodes is sufficiently long, making it possible to alleviate STT stress to maintain a saturation current Ion.

In the above-described example, the gate electrodes 12A to which a signal is input and the gate electrodes 12B applied with the same voltage as that of the back gate are alternately provided. That is, between the transistors driven according to a signal, the single transistor in which the potential of the gate electrode is clipped so as to produce the off state is provided. However, the present invention is not limited to this.

Figure 3:
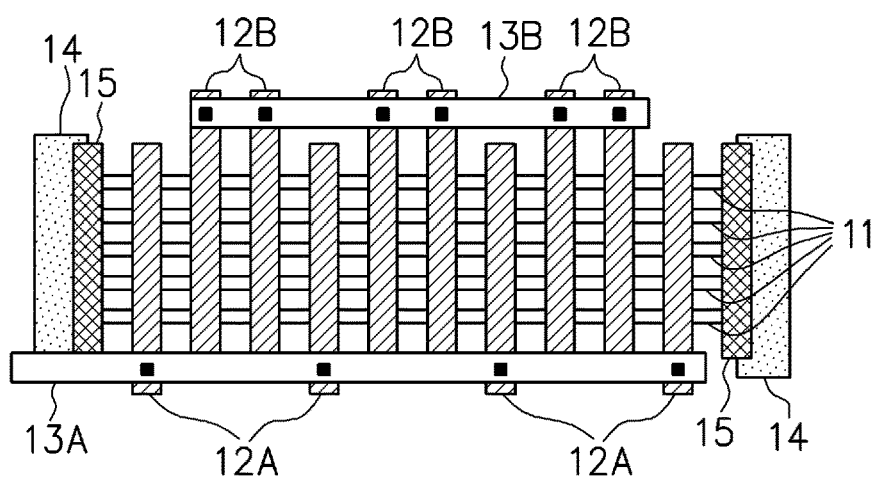
FIG. 3 is a view illustrating another structure example of the semiconductor device in this embodiment.

Any number of the gate electrodes 12B applied with the same voltage as that of the back gate may be provided between each pair of the gate electrodes 12A to which a signal is input, and as illustrated in, for example, FIG. 3, two of the gate electrodes 12B applied with the same voltage as that of the back gate may be provided between each pair of the gate electrodes 12A to which a signal is input. That is, two of the transistors in which the potential of the gate electrodes is clipped so as to produce the off state may be provided between each pair of the transistors driven according to the signal.

Figure 4:
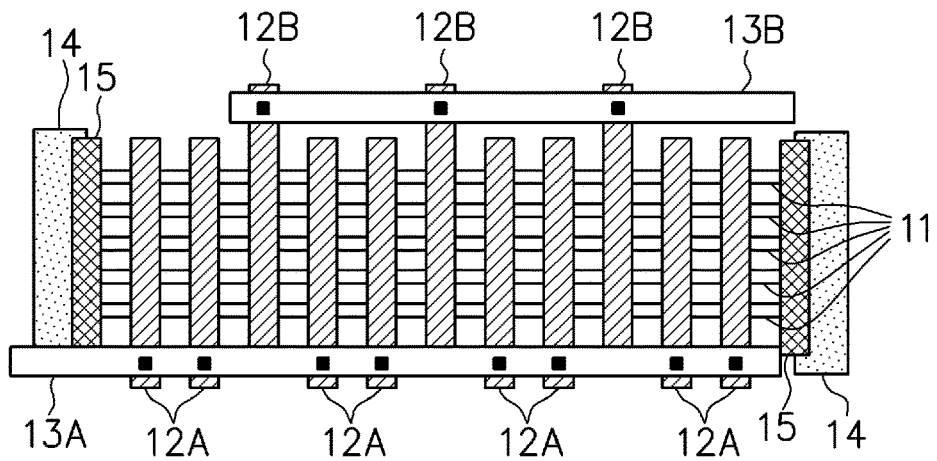
FIG. 4 is a view illustrating another structure example of the semiconductor device in this embodiment.

Further, as illustrated in, for example, FIG. 4, the gate electrodes 12A to which a signal is input may be arranged in sets of adjacent two, and between the sets, the single gate electrode 12B applied with the same voltage as that of the back gate may be provided. That is, the transistors driven according to a signal may be arranged in sets of adjacent two, and between the sets, the single transistor in which the potential of the gate electrode is clipped so as to produce the off state may be provided.

Figure 5:
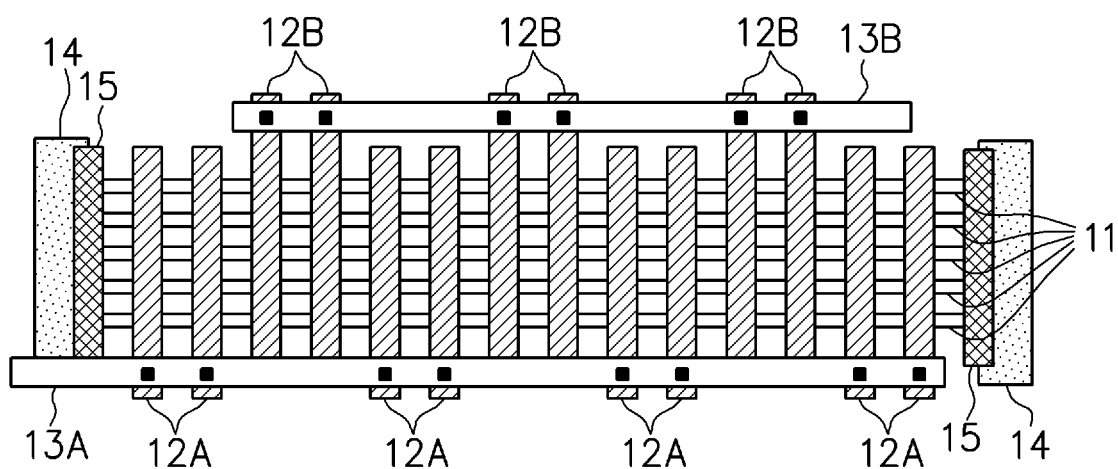
FIG. 5 is a view illustrating another structure example of the semiconductor device in this embodiment.

Further, as illustrated in, for example, FIG. 5, the gate electrodes 12A to which the signal is input may be arranged in sets of adjacent two, and between the sets, two of the gate electrodes 12B applied with the same voltage as that of the back gate may be provided. That is, the transistors driven according to a signal may be arranged in sets of adjacent two, and between the sets, two of the transistors in which the potential of the gate electrodes is clipped so as to produce the off state may be provided. Incidentally, since increasing the number of the adjacently arranged transistors driven according to a signal leads to an increase in heat generation, the number of the adjacently arranged transistors driven according to a signal is preferably not more than two.

Figure 6A:
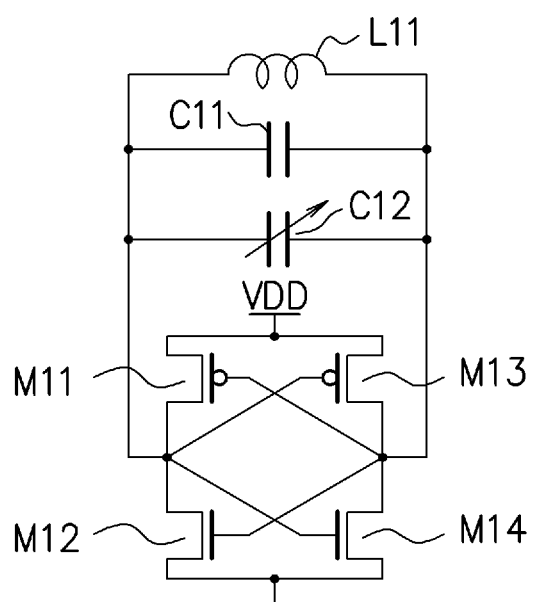
FIG. 6A is a circuit diagram illustrating a configuration example of an oscillation circuit which is an application example of the semiconductor device in this embodiment.

Next, a semiconductor integrated circuit to which the FinFET in this embodiment is applied will be described. FIG. 6A is a circuit diagram illustrating a configuration example of a voltage-controlled oscillation circuit (VCO) as an application example of the FinFET in this embodiment. The voltage-controlled oscillation circuit includes P-channel transistors M11, M13, N-channel transistors M12, M14, an inductor L11, a capacitor C11, and a voltage-controlled variable capacitor C12.

The P-channel transistor M11 has a source connected to a signal line which supplies a power supply voltage VDD and has a drain connected to a drain of the N-channel transistor M12. The N-channel transistor M12 has a source connected to a signal line which supplies a reference voltage (for example, ground CND).

Similarly, the P-channel transistor M13 has a source connected to the signal line which supplies the power supply voltage VDD and has a drain connected to a drain of the N-channel transistor M14. The N-channel transistor M14 has a source connected to the signal line which supplies the reference voltage.

Further, a gate of the P-channel transistor M11 and a gate of the N-channel transistor M12 are connected to an interconnection point of the drain of the P-channel transistor M13 and the drain of the N-channel transistor M14. A gate of the P-channel transistor M13 and a gate of the N-channel transistor M14 are connected to an interconnection point of the drain of the P-channel transistor M11 and the drain of the N-channel transistor M12. That is, a first inverter constituted by the transistors M11, M12 and a second inverter constituted by the transistors M13, M14 are cross-coupled.

Between the interconnection point of the drains of the transistors M11, M12 and the interconnection point of the drains of the transistors M13, M14, the inductor L11, the capacitor C11, and the variable capacitor C12 are connected in parallel.

An oscillation frequency f of the oscillation circuit illustrated in FIG. 6A is determined by the inductor L11, the capacitance C11, and the variable capacitance C12 and is expressed by $f=1/(2\pi\sqrt{(L11(C11+C12))})$. In order to achieve a high oscillation frequency, the inductor L11 or the capacitance C11 is reduced, but too small an inductor L11 makes the oscillation difficult, and accordingly, the capacitance C11 is usually reduced.

Figure 10:
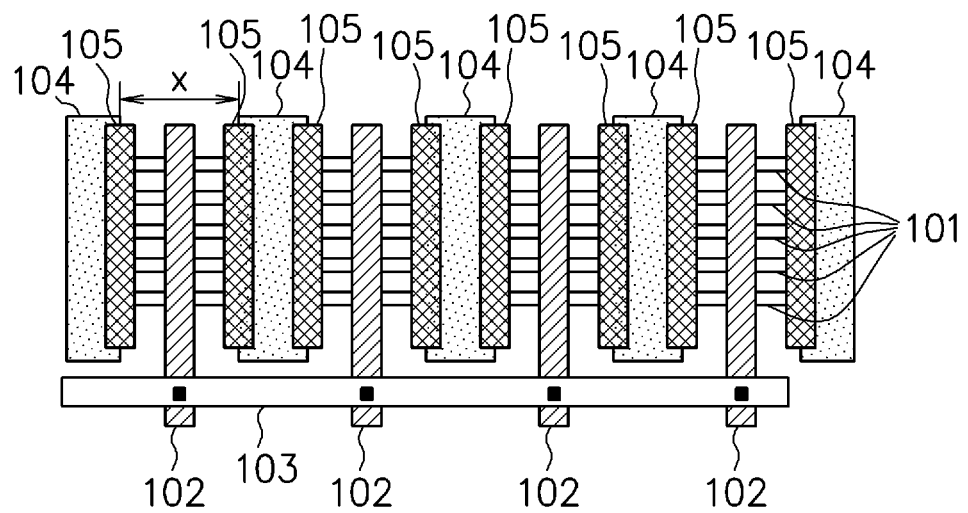
FIG. 10 is an explanatory view of a method to reduce heat generation of a FinFET.
Figure 11:
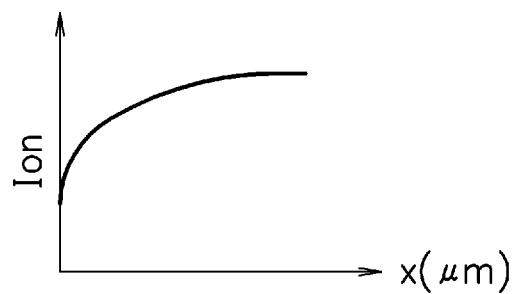
FIG. 11 is a chart illustrating a change in saturation current according to the distance between STIs in a FinFET.

Dominant components of the capacitance C11 are a parasitic load of wiring and a load of the cross-coupled transistors. Further, since an oscillation signal has a sine wave, an on-period of the transistors M11 to M14 is relatively long, which tends to cause heat generation. Here, if an attempt is made to reduce the heat generation by, for example, the method illustrated in FIG. 10, the load by the wiring increases and the saturation current Ion of the transistors reduces, necessitating an increase in the number of transistors. As a result, the capacitance C11 increases, making it difficult to achieve a desired oscillation frequency.

The use of the FinFET in this embodiment as the transistors M11 to M14 enables to reduce the heat generation without reducing the saturation current Ion of the transistors, making it possible to inhibit an increase in the capacitance C11 due to the wiring load and to output a signal with a desired oscillation frequency.

Figure 6B:
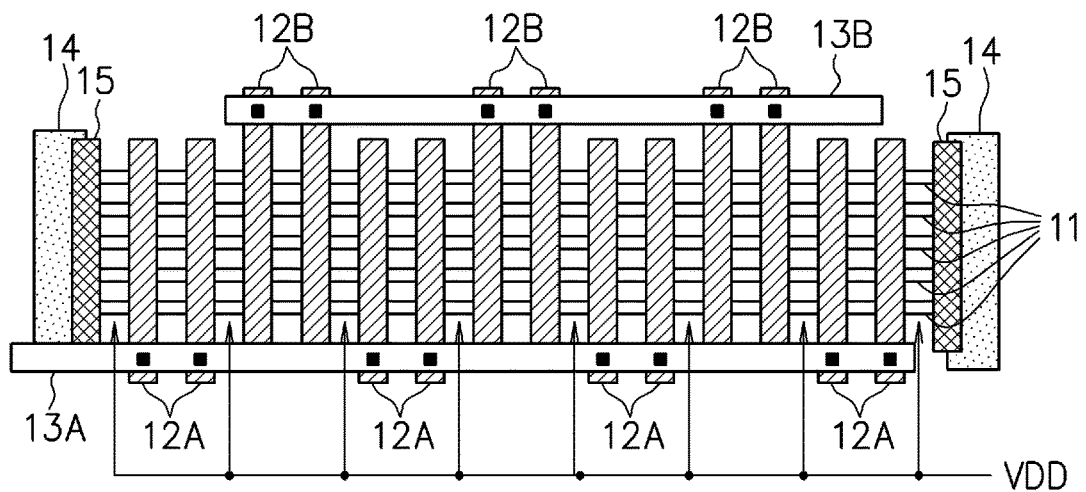
FIG. 6B is a view illustrating a structure example of P-channel transistors illustrated in FIG. 6A.
Figure 6C:
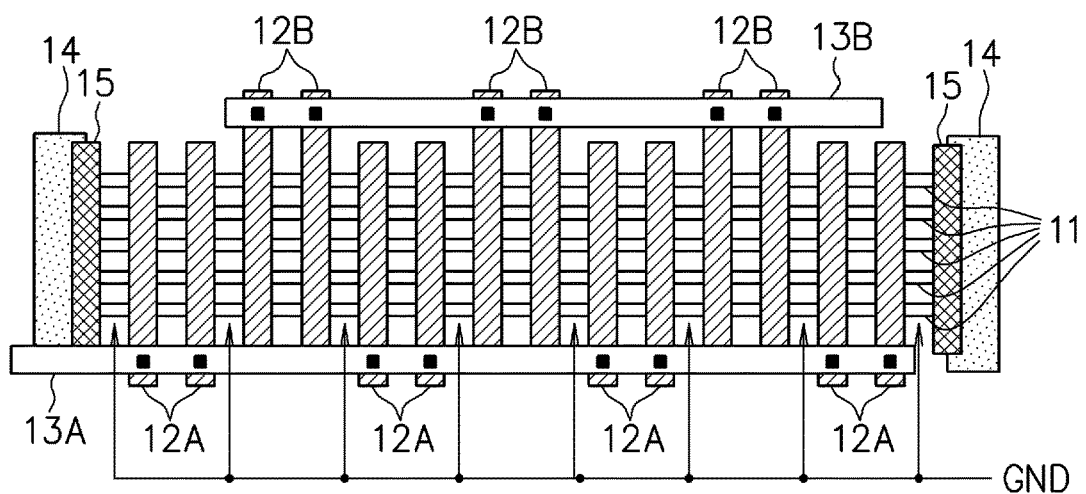
FIG. 6C is a view illustrating a structure example of N-channel transistors illustrated in FIG. 6A.

For example, by structuring the P-channel transistors M11, M13 as illustrated in FIG. 6B and by structuring the N-channel transistors M12, M14 as illustrated in FIG. 6C, it is possible to reduce the heat generation without reducing the saturation current Ion of the transistors. FIG. 6B and FIG. 6C are views illustrating structure examples of the P-channel transistors M11, M13 and the N-channel transistors M12, M14 illustrated in FIG. 6A, respectively, and the same constituent elements as the constituent elements illustrated in FIG. 1 are denoted by the same reference signs.

In the FinFET illustrated in FIG. 6B, in transistors whose gate electrodes are the gate electrodes 12A, source regions are each formed in the semiconductor region 11 between the gate electrode 12A and the gate electrode 12B (or the dummy gate electrode 15), and drain regions are each formed in the semiconductor region 11 between the adjacent gate electrodes 12A. In the transistors whose gate electrodes are the gate electrodes 12A, the source regions are connected through not-illustrated contact electrodes to source electrodes to which the power supply voltage VDD is supplied, and the drain regions are connected to drain electrodes through not-illustrated contact electrodes.

Further, in the FinFET illustrated in FIG. 6C, in transistors whose gate electrodes are the gate electrodes 12A, source regions are each formed in the semiconductor region 11 between the gate electrode 12A and the gate electrode 12B (or the dummy gate electrode 15), and drain regions are each formed in the semiconductor region 11 between the adjacent gate electrodes 12A. In the transistors whose gate electrodes are the gate electrodes 12A, the source regions are connected through not-illustrated contact electrodes to source electrodes to which a reference voltage (for example, ground GND) is supplied, and the drain regions are connected to drain electrodes through not-illustrated contact electrodes.

Figure 7A:
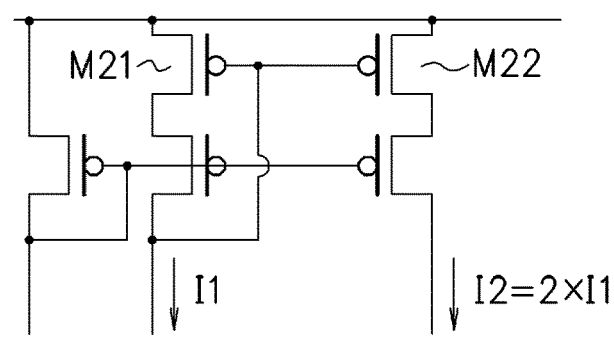
FIG. 7A is a circuit diagram illustrating a configuration example of a bias circuit which is an application example of the semiconductor device in this embodiment.

FIG. 7A is a circuit diagram illustrating a configuration example of a bias circuit as an application example of the FinFET in this embodiment. The bias circuit illustrated in FIG. 7A is a circuit in which P-channel transistors M21, M22 are current-mirror connected and a current twice a current L1 passes as a current I2.

Figure 7B:
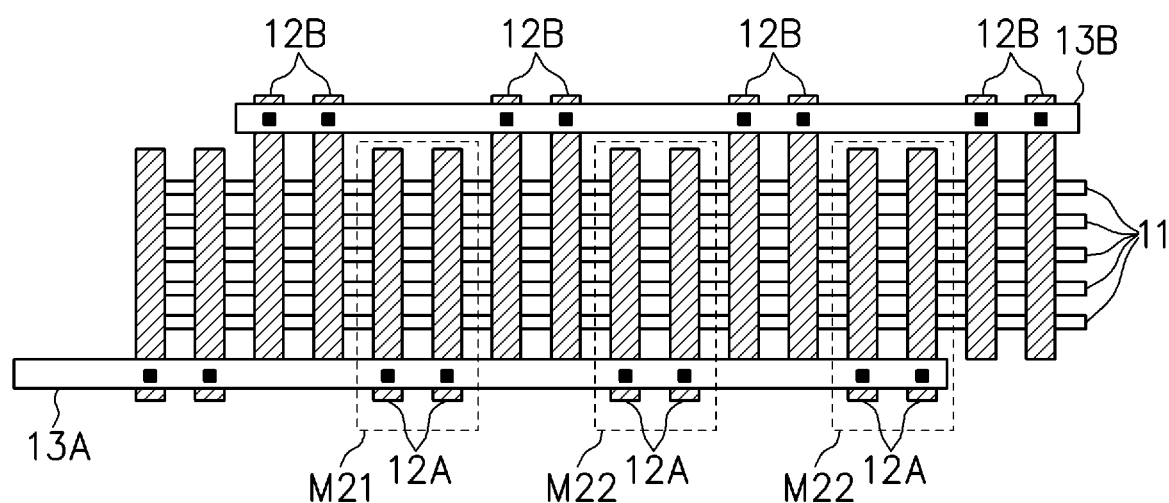
FIG. 7B is a view illustrating a structure example of transistors illustrated in FIG. 7A.
Figure 8:
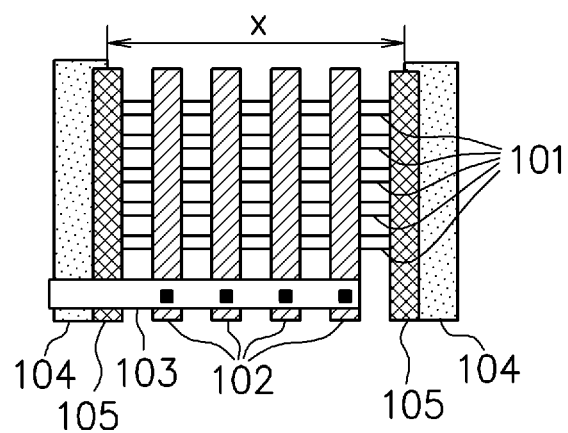
FIG. 8 is a view illustrating structure example of a FinFET having a multi-finger structure.
Figure 9:
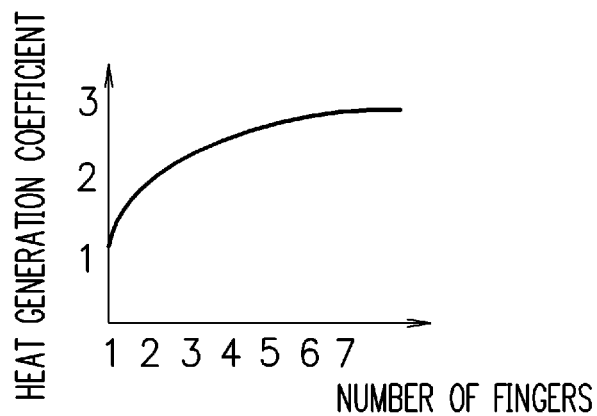
FIG. 9 is a chart illustrating a change in heat generation in accordance with the number of fingers in a FinFET.

For example, by structuring the P-channel transistors M21, M22 as illustrated in FIG. 7B, it is possible to reduce the heat generation without reducing the saturation current Ion of the transistors. FIG. 7B is a view illustrating a structure example of the P-channel transistors M21, M22 illustrated in FIG. 7A, and the same constituent elements as the constituent elements illustrated in FIG. 1 are denoted by the same reference signs. As the P-channel transistor M21, a transistor having a set of the two adjacent gate electrodes 12A is used, and as the P-channel transistor M22, two sets of the two adjacent gate electrodes 12A is used, which makes it possible to pass, as the current I2, a current twice the current I1 flowing in the transistor M21.

Note that the above-described embodiments merely illustrate examples of materialization in implementing the present invention, and the technical scope of the present invention is not to be construed in a restrictive manner by these embodiments. That is, the present invention may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor integrated circuit comprising:
   a first circuit including a plurality of transistors and formed in a semiconductor device, wherein the semiconductor device includes:
      element isolation insulating regions formed in a substrate and including first and second opposed end portions which are opposed to each other;
      a projecting semiconductor region formed on the substrate and extending from the first opposed end portion to the second opposed end portion;
      a pair of dummy gate electrodes formed adjacent to the first and second opposed end portions and formed on both side surfaces and a top surface of both end portions of the projecting semiconductor region, the dummy gate electrodes being electrically floating;
      a plurality of first gate electrodes each formed on both side surfaces and a top surfaces of a first portion of the projecting semiconductor region, the plurality of first gate electrodes being formed between the pair of dummy gate electrodes and being component elements of a plurality of first transistors which are configured to be driven according to signals input to the first gate electrodes, each of the plurality of first transistors being a FinFET; and at least one second gate electrode formed on both side surfaces and a top surface of a second portion of the projecting semiconductor region, the second portion being different from the first portions, the second gate electrode being formed between the first gate electrodes and between the pair of dummy gate electrodes in parallel with the first gate electrodes, in the same layer as a layer where the plurality of first gate electrodes are formed, and being a component element of a second transistor which is applied with a gate voltage such that the second transistor is turned off.

2. The semiconductor integrated circuit according to claim 1, wherein the first circuit is an oscillation circuit including:

inverters cross-coupled to each other and formed by the transistors;

an inductor connected between output nodes of the inverters; and a capacitor connected in parallel to the inductor between the output nodes of the inverters.

3. The semiconductor integrated circuit according to claim 1, wherein the first circuit is a bias circuit including:

a first transistor which is one of the plurality of transistors; and a second transistor which is another one of the plurality of transistors and current-mirror connected to the first transistor.

4. The semiconductor integrated circuit according to claim 1, wherein the second gate electrode of the transistor is applied as the gate voltage with a voltage equal to a voltage of a back gate of the second transistor.

5. The semiconductor integrated circuit according to claim 1, wherein the second gate electrodes are formed between respective ones of the plurality of first gate electrodes, respectively.

6. The semiconductor integrated circuit according to claim 1, wherein the second gate electrodes are formed between respective sets of the first gate electrodes, respectively, the sets each consisting of adjacent two of the first gate electrodes.

7. The semiconductor integrated circuit according to claim 1, wherein the semiconductor device further includes:

source regions and drain regions formed in the projecting semiconductor region at both sides of the first gate electrodes and the second gate electrode, and wherein the plurality of first transistors and the plurality of second transistors include the source regions and drain regions.

8. The semiconductor integrated circuit according to claim 1, wherein each of the plurality of transistors is a FinFET.

* * * * *